OR  4,054,357

United States Patent
Lurie

[11] 4,054,357
[45] Oct. 18, 1977

[54] PROVIDING A REPRESENTATION OF INFORMATION STORED IN A HOLOGRAM

[75] Inventor: Michael Jay Lurie, East Brunswick, N.J.

[73] Assignee: RCA Corporation, New York, N.Y.

[21] Appl. No.: 640,146

[22] Filed: Dec. 12, 1975

[51] Int. Cl.² .............................................. G06G 9/00
[52] U.S. Cl. .................................................. 350/3.5
[58] Field of Search ............................ 350/3.5, 161; 340/173 LT, 173 LM; 235/181

[56] References Cited
U.S. PATENT DOCUMENTS

| | | | |
|---|---|---|---|
| 3,885,143 | 5/1975 | Ishii | 350/3.5 |
| 3,887,276 | 6/1975 | Clay et al. | 350/3.5 |

*Primary Examiner*—William L. Sikes
*Attorney, Agent, or Firm*—Leonard Weiss; H. Christoffersen; Joseph D. Lazar

[57] ABSTRACT

A holographic recording of a plurality of rows of informational elements, which may represent a binary number, is successively illuminated by each of a plurality of light sources, where the number of light sources equals the number of rows of elements. In response to the successive illumination, a holographic reconstruction of the elements is projected upon photodetectors disposed along a line in a projection plane. The illumination may be instead by a deflected beam having an angle of incidence with the recording which changes at a vertical scan rate. In response to the deflected beam, a holographic reconstruction of horizontal lines of the elements are successively projected upon the photodetectors.

4 Claims, 6 Drawing Figures

PROVIDING A REPRESENTATION OF INFORMATION STORED IN A HOLOGRAM

BACKGROUND OF THE INVENTION

1. Field of the Invention

This invention relates to holography and more particularly to providing signals representative of information stored in a hologram.

2. Description of the Prior Art

The holographic art has been used for storing information in a multiplicity of applications, including a storage of a binary identification number on an identification card and a storage of an image on tape.

The identification card of the prior art typically has integral therewith a hologram which is a representation of a group of bits (ONE's and ZERO's) comprising the identification number. The genuineness of the card is verified by an apparatus which illuminates the hologram with a reconstructing beam of coherent light. In response to the reconstructing beam, a first order diffraction beam, representative of the group of bits, emanates from the hologram. The first order beam projects the representation of the group upon an array of detectors included in the apparatus.

The number of detectors in the array equals the number of bits in the group, each of the detectors providing a digital signal representative of a bit. In response to the projection of the group, the array provides a digital signal representation of the identification number. The verification apparatus additionally can include a data processing unit which compares the signal representation with signals representative of a multiplicity of issued numbers. When the identification number equals an issued number, the data processing unit generates an indication of the verification.

In a similar manner, the tape of the prior art has integral therewith a holographic recording of an image. In response to the reconstructing beam illuminating the holographic recording, a first order diffraction beam emanates therefrom whereby a representation of the image is projected upon a matrix of detectors. Typically, the matrix is comprised of 525 rows, each row including four hundred detectors (a 400 × 525 matrix). In response to the projection of the image, detectors of the matrix provide signals having amplitudes respectively representative of locations on the image. Typically, signals from the matrix are provided to a television signal processing unit.

It should be appreciated that because of the number of detectors in the array and the number of detectors in the matrix, both arrangements are costly. Additionally, the numbers of detectors cause the processing units to be costly.

SUMMARY OF THE INVENTION

According to the present invention, a first reconstructing beam of light has a first angle of incidence with a hologram having first and second groups of elements recorded thereon, the first beam causing a holographic reconstruction of the first group to be projected upon a plurality of photodetectors, whereby the photodetectors provide a signal representation of the first group; a second reconstructing beam having a second angle of incidence with the hologram causes a holographic reconstruction of the second group to be projected upon the photodetectors, whereby the photodetectors provide a signal representation of the second group.

DESCRIPTION OF THE PREFERRED EMBODIMENT

The present invention is predicated upon changing an angle of incidence which a reconstructing beam of light has with a hologram, thereby causing a change of a location of a projection of a holographic reconstruction of information recorded in the hologram.

Figure 1:
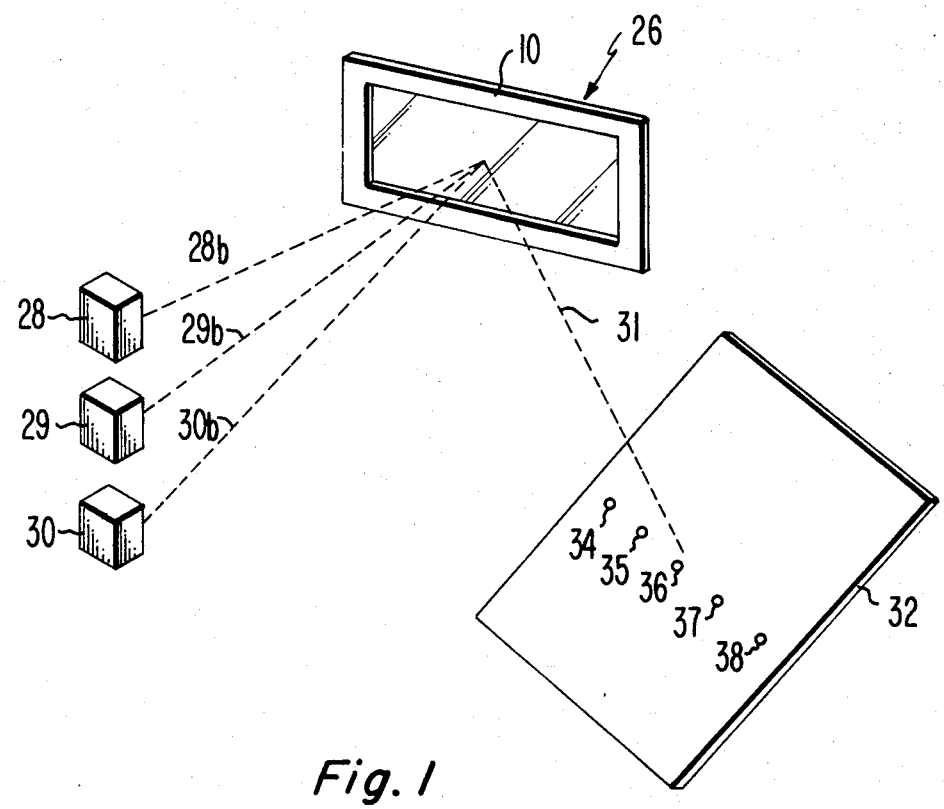
FIG. 1 is a schematic diagram of apparatus for providing a digital signal representation of a binary number stored in a hologram according to a first embodiment of the invention.
Figure 2:
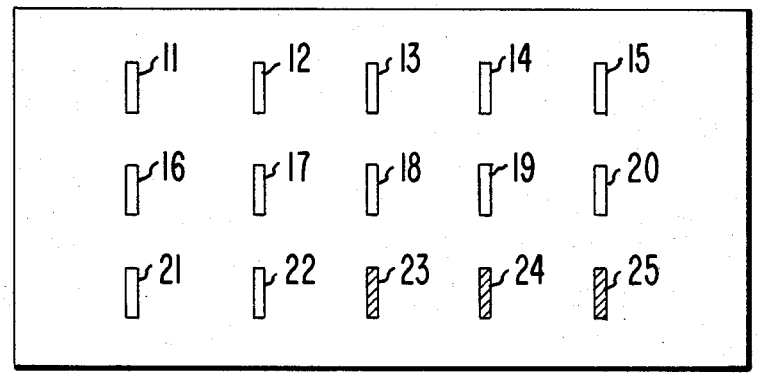
FIG. 2 is a holographic reconstruction of elements stored in the hologram of FIG. 1.

Referring to FIGS. 1 and 2, in a first embodiment of the present invention, elements 11-25 (FIG. 2) are included in a holographic reconstruction of exemplary elements of a data bearing image recorded in a hologram 10 (FIG. 1). The elements 11-15, the elements 16-20, and the elements 21-25 are disposed in first, second, and third rows, respectively.

The elements 11-25 are each representative of a bit of a binary identification number. For example, the elements 11-22 are each representative of ONE and the elements 23-25 are each representative of ZERO.

The hologram 10 is integral with a credit card 26 (or other carrier) which is positioned within an apparatus for verifying the identification number. The apparatus includes coherent light sources 28-30 which each illuminate the entire hologram 10 with coherent reconstructing beams 28b-30b, respectively. The beams 28b-30b have respective first, second, and third angles of incidence with the hologram 10. In an alternative embodiment, the sources 28-30 may provide incoherent light.

In response to an illumination of the hologram 10 by a reconstructing beam of light, a first order diffraction beam 31, emanating from the hologram 10, is transmitted to a projection plane 32 whereby the elements 11-25 are projected upon the plane 32. It should be understood that the first order beam 31 emanates from the hologram 10 at an angle having a known relationship to the angle of incidence of the reconstructing beam. Therefore, the location of the elements 11-25 projected on the plane 32 changes in response to a change in the angle of incidence of the reconstructing beam.

Disposed substantially along a line in the plane 32 are photodetector diodes 34-38 which each provide a signal proportional to an intensity of illumination thereof. As explained hereinafter, the diodes 34-38 provide a digital signal representation of the identification number.

Figure 3:
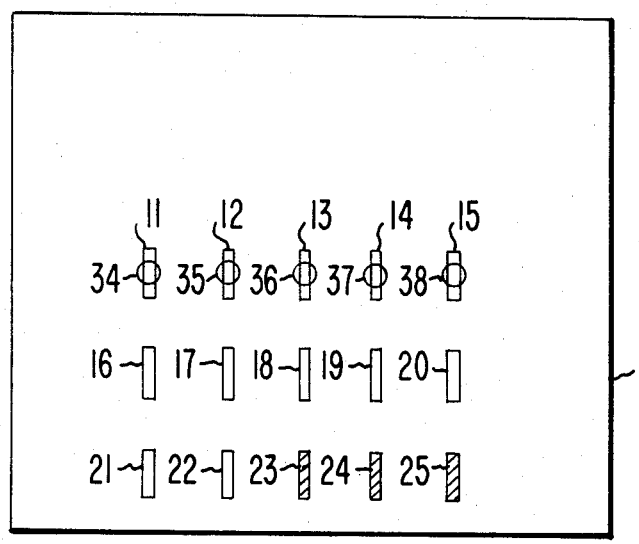
FIGS. 3-5 are plan views of a plane upon which the holographic reconstruction of FIG. 2 is projected.

Referring to FIG. 3, in response to an illumination of the hologram 10 by the beam 28b, the corresponding first angle of incidence causes a projection of the reconstruction of the data bearing image on the plane 32, with the elements 11-15 (the first row) projected upon the diodes 34-38, respectively. The projection of the elements 11-15 causes the diodes 34-38 to provide a digital signal representation of bits represented by the elements 11-15. Therefore, because the beam 28b has the first angle of incidence with the hologram 10, the diodes 34-38 provide the electrical signal representation of the bits represented by the elements 11-15.

Figure 4:
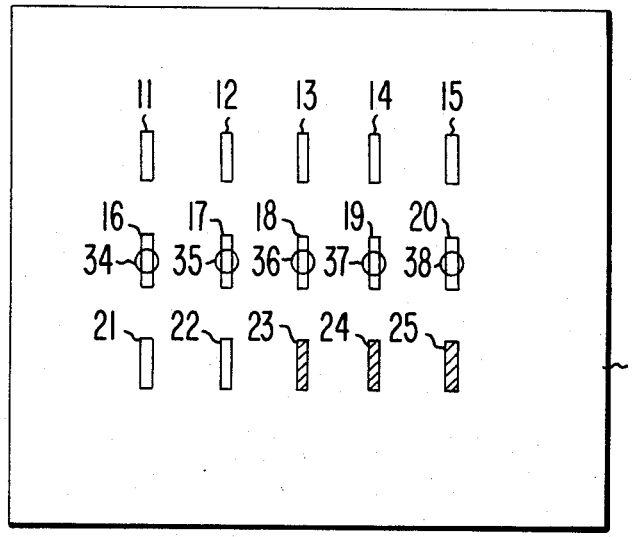

Referring to FIG. 4, in response to an illumination of the hologram 10 by the beam 29b, the corresponding second angle of incidence causes a projection of the reconstruction of the data bearing image on the plane 32, with the elements 16-20 (the second row) projected upon the diodes 34-38, respectively. The projection of the elements 16-20 causes the diodes 34-38 to provide a digital signal representation of the bits represented by the elements 16-20. Therefore, because the beam 29b has the second angle of incidence with the hologram 10, the diodes 34-38 provide the signal representation of the bits represented by the elements 16-20.

Figure 5:
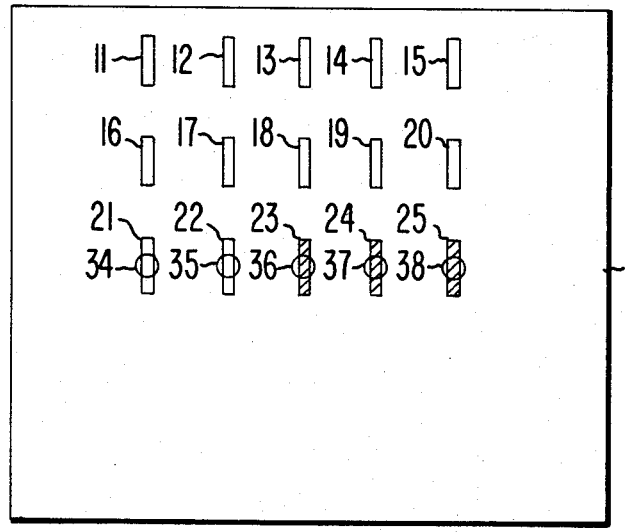

Referring to FIG. 5, in a manner similar to that described in connection with FIG. 3 and FIG. 4, an illumination of the hologram 10 by the beam 30b causes a projection of the reconstruction of the data bearing image on the plane 32 with the elements 21-25 (the third row) projected upon the diodes 34-38. In response to the illumination by the beam 30b, the diodes 34-38 provide a digital signal representation of the bits represented by the elements 21-25. Accordingly, in response to the successive illumination of the hologram 10 by the sources 28-30, the diodes 34-38 provide signals which are cumulatively representative of all of the bits represented by the elements 11-25. Therefore, the successive illumination of the hologram 10 causes the diodes 34-38 to provide the digital signal representation of the identification number.

A data processing unit may be connected to the diodes 34-38 to provide a verification signal in response to the identification number equalling one of a multiplicity of issued numbers.

Thus there is described hereinbefore an apparatus for providing a signal representation of an image recorded in a hologram. The apparatus includes a number of detectors equal to a number of elements in one of a plurality of rows of elements of the recorded image.

Figure 6:
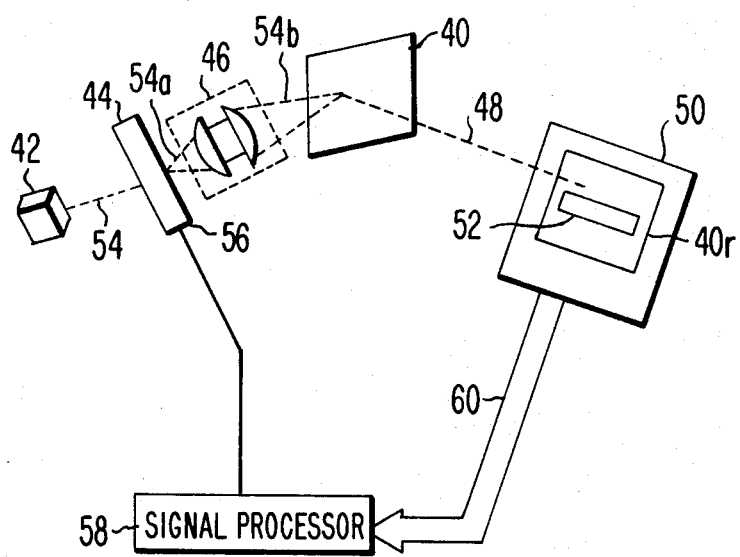
FIG. 6 is a schematic block diagram of apparatus for providing a signal representation of an image stored in a hologram according to a second embodiment of the invention.

Referring to FIG. 6, in a second embodiment of the present invention, a hologram 40 is a recording of a pictorial image. The entire hologram 40 is illuminated by a coherent light source 42 via an acoustic grating deflector 44 and a relay lens system 46, which are described hereinafter. In response to the illumination of the hologram 40, emanating therefrom is a first order diffraction beam 48 which projects a holographic reconstruction 40r of the pictorial image upon a projection plane 50.

Disposed substantially along a line in the plane 50 are four hundred photodetector diodes 52 (similar to the diodes 34-38). A holographic reconstruction of four hundred elements along a horizontal line of the pictorial image is projected upon the diodes 52 in a manner similar to that described in connection with the first embodiment. In response to the projection of the holographic reconstruction of the four hundred elements, signals representative thereof are provided by the diodes 52.

The grating deflector 44, referring to hereinbefore, receives a light beam 54 from the source 42. Additionally, the grating deflector 44 has an electrical input 56 connected to a signal processor 58 whereby a scanning signal is provided to the grating deflector 44. In response to the scanning signal and the beam 54, the grating deflector 44 transmits therethrough a light beam 54a having a deflection which changes at a vertical scan rate, similar to a vertical scan rate of a television camera.

The beam 54a is transmitted to the relay lens system 46 referred to hereinbefore, whereby a reconstructing beam 54b emanating therefrom is transmitted to the hologram 40. The reconstructing beam 54b and the hologram 40 have an angle of incidence therebetween dependent on the deflection of the beam 54a. The beam 54b has a cross-sectional dimension sufficiently large to illuminate the entire hologram 40.

Because the beam 54a is deflected at the vertical scan rate, the angle of incidence of the reconstructing beam 54b changes at the vertical scan rate. In response to the change of the angle of incidence of the beam 54b, the holographic reconstruction 40r moves at the vertical scan rate in a vertical direction on the plane 50. The movement of the holographic reconstruction 40r causes the diodes 52 to provide signal representations of successive horizontal lines of elements of the pictorial image. Therefore, the deflection of the beam 54a corresponds to a vertical scan of the pictorial image by a television camera. Typically, a television camera produces signal representations of 525 horizontal lines to represent a pictorial image.

The diodes 52 are connected to the signal processor 58 through a plurality of signal lines 60, thereby providing the signal representation (a line at a time) of the pictorial image to the signal processor 58. Within the signal processor 58 the outputs of the diodes 52 are sequentially scanned by an electronic scanner at a horizontal line rate corresponding to a horizontal line rate of a television camera. The scanner provides a video signal to a television type of display unit (not shown), whereby the pictorial image appears on the display.

What is claimed is:

1. Apparatus used with a hologram for providing a signal representation of first and second groups of elements of an image recorded in said hologram, comprising:

reconstructing means for providing a single beam of light incident to said hologram:

means for controlling the angle of incidence of said beam with said hologram; and detector means, including a fixedly disposed array of photodetectors, for providing a signal representation of elements of said first and second groups in response to a projection of holographic reconstructions thereof caused by said beam having first and second angles of incidence, respectively.

2. Apparatus according to claim 1 wherein said groups each comprise a row of a known number of said elements, said photodetectors being disposed substantially along a line within a projection plane where the number of said photodetectors in said array equals said known number.

3. Apparatus according to claim 1 wherein said controlling means comprises deflection means for deflecting said beam to cause a change in said angle of incidence.

4. Apparatus according to claim 3 wherein said deflection means comprises an acoustic grating deflector having an electrical input connected to a pulse source, said groups being elements disposed in horizontal rows of said image whereby said change of said angle of incidence corresponds to a vertical scan of said image.

* * * * *